United States Patent [19]
Cota et al.

[11] 4,250,148
[45] Feb. 10, 1981

[54] APPARATUS AND METHOD FOR PRODUCING POLYCRYSTALLINE RIBBON

[75] Inventors: Marlo E. Cota, Scottsdale; Richard W. Gurtler, Mesa, both of Ariz.

[73] Assignee: Motorola, Inc., Schaumburg, Ill.

[21] Appl. No.: 925,734

[22] Filed: Jul. 18, 1978

[51] Int. Cl.³ .............................................. B01D 9/00
[52] U.S. Cl. .......................... 422/246; 156/DIG. 88; 156/613; 264/81
[58] Field of Search ................. 264/81; 118/718, 724, 118/725, 729, 730; 156/613; 422/246

[56] References Cited

U.S. PATENT DOCUMENTS

| | | | |
|---|---|---|---|
| 3,900,540 | 8/1975 | Robba | 264/81 X |
| 3,900,943 | 8/1975 | Sirtl | 29/572 |
| 4,065,533 | 12/1977 | Koppl | 264/81 |

*Primary Examiner*—Thomas P. Pavelko
*Attorney, Agent, or Firm*—John A. Fisher

[57] ABSTRACT

A method for the substantially continuous growth of polycrystalline silicon ribbon. The polycrystalline silicon is chemically vapor deposited on elongated foils which move slowly through a resistance heated furnace chamber. Vapor sealing entrance and exit ports are provided which allow the continuous transfer of the foils and polycrystalline ribbon between the chamber and the ambient. The foils are positioned within the chamber so as to mask the chamber walls and to restrict the deposition to the foils. All deposition of polycrystalline silicon takes place on one side of each of the foil pieces; deposition on the edges or backs of the foils is prevented by the positioning of the foils relative to each other. Adhesion of the foils to each other is prevented by insuring that all foils are in relative motion. The process is highly efficient and cost effective because it employs efficient resistance heating, because the only surfaces which the reactant gases can contact are hot and are regions of desired deposition, and because the length of the reaction zone can be made long enough to obtain an optimum amount of gas reaction.

7 Claims, 9 Drawing Figures

APPARATUS AND METHOD FOR PRODUCING POLYCRYSTALLINE RIBBON

BACKGROUND OF THE INVENTION

This invention relates to a method and apparatus for the substantially continuous deposition of polycrystalline silicon ribbon. More particularly, this invention relates to a highly efficient, cost effective method and apparatus for the substantially continuous deposition of polycrystalline silicon ribbon on foils from which the ribbon can be removed by shear separation.

The semiconductor industry uses large quantities of high quality moncrystalline silicon in the form of thin sheets or wafers. The need for this type of silicon is growing rapidly, especially with the increasing interest in the use of solar cells for the production of electrical power. Most silicon wafers are produced by growing a monocrystalline silicon ingot, sawing the ingot into thin wafers, and then lapping and polishing the wafers to the desired thickness and surface finish. This is an extremely costly process. While the cost may be acceptable for the production of transistors, integrated circuits, and the like, the cost of these wafers is unacceptably high if solar cells are to be competitive for the large scale production of electricity.

Other techniques have been developed for the production of thin sheets of silicon suitable for the production of solar cells. One of these is the so-called ribbon-to-ribbon (RTR) growth process which is expected to yield high quality substrates for use in solar cell fabrication as well as for use in the production of a variety of other semiconductor products. The RTR process uses a scanned laser beam to locally melt a polycrystalline ribbon and to induce crystal growth as the ribbon is translated through the laser beam. Thus a polycrystalline ribbon is transformed into a macrocrystalline ribbon. A macrocrystalline structure is one in which the crystals are of sufficiently large size to permit efficient semiconductor action. Therefore a monocrystalline ribbon wherein the ribbon is but a single crystalline body is encompassed within the term macrocrystalline. In this context the word "ribbon" implies a long strip having a width much greater than its thickness. Typical dimensions might be a length of several meters, a width of 1 to 10 centimeters and a thickness of 50 to 250 micrometers. Although the RTR process has proved to be viable for the production of macrocrystalline substrates, a fundamental stumbling block to the overall process has been that of supplying the required polycrystalline silicon ribbon starting material. A number of techniques have been proposed for solving this problem, but none have proved highly successful. One technique, for example, takes silicon powder, compacts it to the desired shape, and thus fuses it into a solid body by scanning with an electron beam or a laser beam. Another technique involves the chemical vapor deposition of polycrystalline silicon on a foreign substrate. As practiced theretofore, however, this process has been unacceptable since it is a discontinuous process carried out in a conventional RF heated furnace. The process is inefficient and expensive because of the method of heating used, the incomplete reaction of the gases employed, the deposition of silicon on other than desired surfaces, and the discrete as opposed to continuous nature of the process.

Accordingly, it is an object of this invention to provide a method and apparatus for the substantially continuous, cost effective growth of polycrystalline silicon ribbon.

It is a further object of this invention to provide a method and apparatus for the growth of epitaxial layers on monocrystalline silicon substrates.

BRIEF SUMMARY OF THE INVENTION

In one embodiment of this invention a method and apparatus are provided for the substantially continuous chemical vapor deposition of polycrystalline silicon ribbon on an elongated foil substrate. A plurality of foil substrates are moved through a resistance heated furnace in such a fashion as to mask and impede silicon deposition on the furnace walls. The foils, moving relative to each other, are also positioned to impede silicon deposition on either the edges or the back sides of the foils. The apparatus provides plenums at the ends of the furnace to control the introduction of reactant gases and the venting of reaction products. The plenums seal the ends of the furnace, but still allow the continuous input of foils and the output of foils plus polycrystalline silicon ribbon. Means are also provided for the shear separation of the polycrystalline silicon ribbon from the foil, for the collection of the ribbon, and for the recycling of the foil.

BRIEF DESCRIPTION OF THE DRAWINGS

The invention will be better understood after consideration of a more detailed description of the invention taken in connection with the drawings in which.

DETAILED DESCRIPTION OF THE INVENTION

Figure 1:
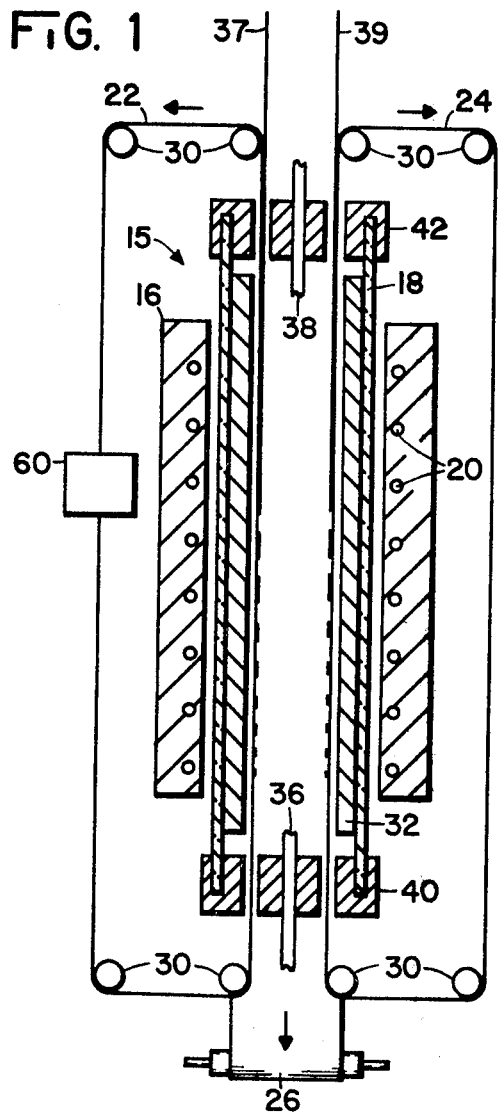
FIG. 1 is a cross-sectional side view of one embodiment of the apparatus.

FIG. 1 shows a cross-sectional side view of a preferred apparatus 15 for practice of the invention. The apparatus 15 comprises a furnace 16 having a furnace liner or tube 18 through its center. Resistance heating elements 20 surround the central portion of the tube 18 to provide a heated reaction zone. The furnace 16 can be similar to a conventional diffusion or oxidation furnace as is well known in the semiconductor art. For reasons which will later become obvious, it is preferred that the furnace 16 and furnace tube 18 be vertically disposed in contrast to the conventional horizontal manner. The furnace tube 18 can be quartz or other refractory material. Heating by means of resistance heating elements 20 is preferred to other heating techniques such as RF induction heating or radiant heating because of the isothermal heating condition and the energy efficiency of resistance heating when coupled with a well insulated furnace 16. In this embodiment of the invention four thin, elongated metal foils 22, 24, 26 and 28 (foil 28 cannot be seen in this sectional view) are made to move through the furnace tube 18. The foils move on rollers 30 and are guided within the tube by a guide block 32 which is shown in more detail in FIG. 2.

Figure 2:
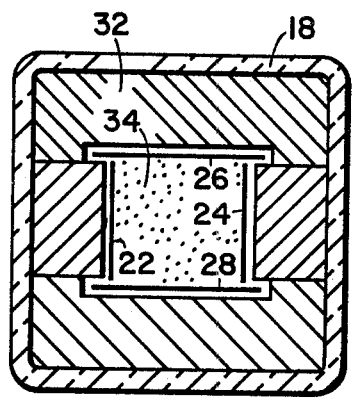
FIGS. 2 and 3 are cross-sections of two embodiments of the invention.

FIG. 2 shows a cross section through furnace tube 18 which, in this configuration, is a rectangular quartz tube. The tube 18 could, of course, be of round or other convenient cross section and might be fabricated from materials other than quartz, such as alumina, silicon carbide, or the like. The guide block 32 fits inside furnace tube 18 and can be made of quartz, alumina, molybdenum, or other refractory material. Most conveniently, guide block 32 can be milled from four separate pieces of material and then fastened together. The foil members 22, 24, 26, and 28 are positioned by the shape of the guide block 32. So arrayed, the foils define and surround a reaction volume 34.

The apparatus shown in FIG. 1 also comprises inlet nozzle 36 which allows the injection of reactant vapors into the reaction volume and exhaust nozzle 38 for the removal of reaction products from the furnace. Vapor seals 40, 42 which will be discussed in greater detail later, seal the ends of the tube to control the ambient within the reaction volume, while allowing for the entrace and exit of the metal foils and the reaction gases.

The reactant vapors injected through the inlet nozzle 36 are silicon bearing compounds which yield free silicon in the reaction volume at the temperature maintained by the furnace and deposit polycrystalline silicon on any hot surface which they contact. The particular mechanism involved in the production of the free silicon will depend on the gas composition: e.g. $SiH_4$; $H_2$ mixtures lead to free silicon, through thermal dissociation while chlorosilanes may produce free silicon by means of a reduction reaction. For purposes of this description, "reaction" is intended to be a general term, inclusive of more specific mechanisms. As shown in FIG. 2, the reaction volume 34 is bounded by the moving foils 22, 24, 26, 28. The silicon made available by the reaction of the reactant gases deposits only on the inner surfaces of these foils. No deposition occurs on the edges of the foil because of the masking either by the guide block 32 or by an adjacent foil. Deposition is minimized in the corners defined by two adjacent foils and on the outer surface of the foils because gas transfer to those areas is inhibited. Little deposition takes place on the guide block itself because of masking by the foils. Any deposition that does take place on the guide block is removed by the abrading action of the moving foils. This configuration is highly efficient since the only surfaces which the gas can contact are hot and are regions of desired deposition. Thus all of the silicon released from the reactant gases results in useful polycrystalline silicon. In addition, since deleterious deposition of polycrystalline silicon is prevented, there is no furnace down time required for cleaning unwanted polycrystalline silicon from the furnace tube 18 nor from the guide block 32. This is in contrast to any of the prior art systems which all require some down time for cleaning.

The deposited silicon can potentially act as a binding agent to stick together various parts of the apparatus. The sticking together of adjacent foils can be prevented, however, by having adjacent foils in relative motion with respect to each other. For example, foils 22 and 24 could be moving in one direction while foils 26 and 28 are moving in the opposite direction. Alternatively, all of the foils could be moving in the same direction but at different relative speeds. The former technique is preferred, since the amount of polycrystalline silicon deposited on the foil is determined by the length of time the foil is within the heated reaction zone. By moving all of the foils at substantially the same speed, but in opposite directions, polycrystalline ribbon of the same thickness will be deposited on each foil.

Figure 3:
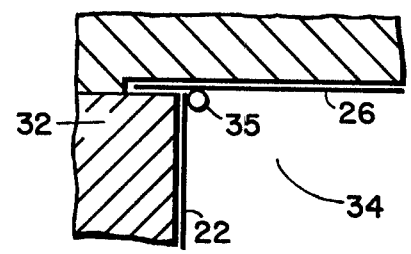

FIG. 3 depicts a further embodiment of the invention. The corner of the guide block 32 is shown with two of the foils 22, 26. In addition, an additional wire element 35 has been added. The wire 35 serves two purposes; it helps keep foil 22 in proper position adjacent to the guide block 32, and it also helps prevent polycrystalline growth in the corner region. Preventing growth in the corner further precludes any possibility of the two foils sticking together and insures that no polycrystalline silicon will grow on the edge of foil 22. Some deposition of silicon will occur on the wire itself, thus representing some waste of silicon, but this amount will be small because of the size of the wire. To prevent sticking between the wire and the foil, the wire is kept in relative motion with respect to either foil.

As each of the metal foils passes through the heated furnace, a uniform film of polycrystalline silicon is deposited on one side of the foil. The polycrystalline silicon film and the foil, in effect, form a bimetallic strip which is in thermal equilbrium while it is within the furnace. After the strip exits the furnace, the difference in thermal expansion coefficients of the silicon relative to the metal foil leads to shear stresses as the temperature of the moving foil is reduced. These shear stresses, which are concentrated near the edges of the foil, cause shear separation of the polycrystalline deposit from the foil substrate. This is shown, for example, by the polycrystalline silicon ribbons 37, 39 which have separated from the metal foils 22 and 24, respectively, in FIG. 1. The polycrystalline silicon ribbon can be fed directly into a ribbon-to-ribbon converting apparatus or can be stockpiled for later conversion to macrocrystalline silicon. It may be desirable to enhance the shear separation, for example, by providing a controlled thermal shock as the foil and ribbon exit the furnace. The thermal shock can be provided by passing the bimetallic strip through a region with a specific temperature profile optimized to ensure a continuous "peeling" of the deposit from the substrate. The specific profile can be achieved, for example, by using an impinging stream of cool gas. The shear separation can also be enhanced by applying tension to the metallic foil. This tensioning can be accomplished by adjusting the position of the rollers 30. In order for the shear separation to be successful, it is imperative that the deposition take place only on the major face of the foil, and not wrap around the edges of the foil. This is successfully accomplished, as described above, by the positioning of the foils, by the masking of adjacent foils, and by the possible use of the moving wire mask in the corner regions. Prior art methods have tried to accomplish this restricted deposition, for example, by depositing through a mask onto a substrate. That technique, however, requires the periodic cleaning of deposited material from the mask. This represents both a waste of silicon and an interruption of the deposition cycle.

Figure 4:
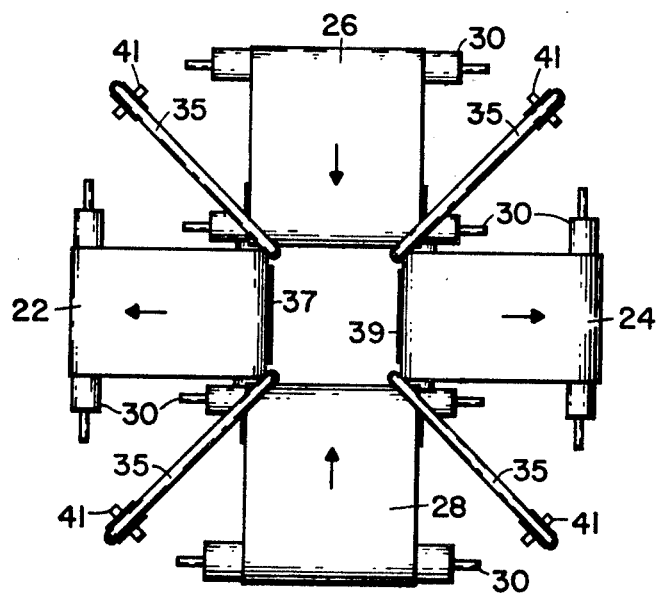
FIG. 4 is an end view of the apparatus shown in FIG. 1.

FIG. 4 shows a possible arrangement for controlling the movement of the foils, wires, and ribbon. The wires 35 could be continuous and wrap around to the opposite end of the furnace, or could be collected on the spools 41. After a period of time the direction of the motion of the wires could be reversed without interrupting the deposition process, and the wires unwound from the spools 41 and collected on similar spools at the other end of the furnace. Foils 22 and 24 are shown as they exit the furnace controlled by the rollers 30. The associated polycrystalline ribbons 37, 39 can be brought straight out of the furnace to avoid positional conflict with the associated foils and rollers. Foils 26 and 28 are directed into this end of the furnace and will exit the opposite end with the deposited polycrystalline silicon ribbon thereon.

Figure 5:
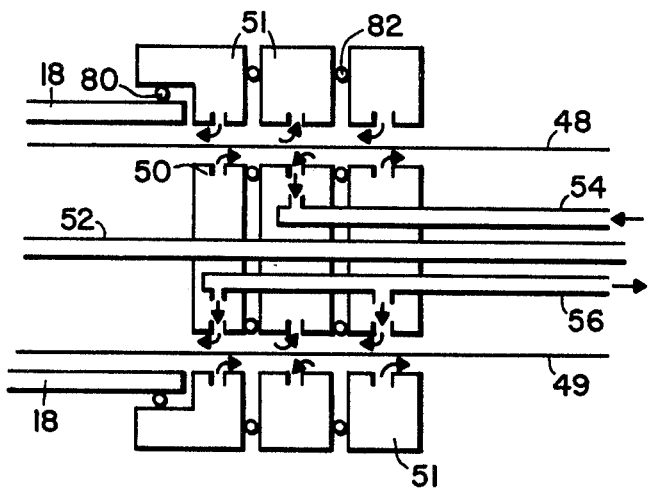
FIG. 5 is a cross-sectional view of a vapor sealing means.
Figure 6:
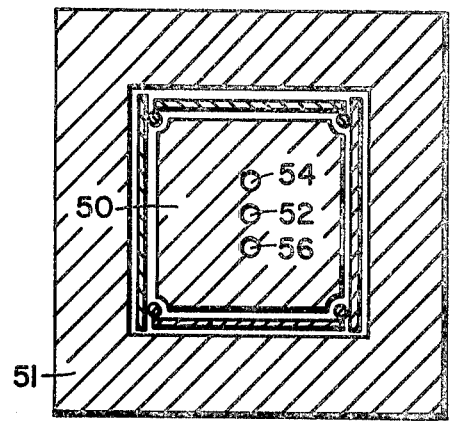
FIGS. 6–9 are cross sections of further embodiments of the invention.

Means for sealing the ends of the furnace tube 18 are shown in cross section in FIG. 5. The seals must provide for control of the ambient within the furnace tube, allowing the injection of reactant gases and the exhaust of the reaction products, while allowing the smooth passage of the foils, ribbons, and wires. Such sealing is accomplished by a series of inner and outer plenums 50, 51 located at both the input and exhaust ends of the tube. The inner and outer plenums are positioned to provide a mild wiper seal (for clarity the wipers are not shown) to both sides of the passing foils, ribbons, and wires as a first means for controlling the ambient. The reaction gases are plumbed to pass through the plenums at the input end while the reaction products are plumbed through the plenums at the exhaust end with the plenums supporting and positioning the input and exhaust nozzles. The plenums are a series of alternating pressurized and evacuated cells with inner 50 and outer 51 cells being similar. An O-ring 80 seals the outer plenum to the furnace tube 18 while O-rings 82 provide seals between adjacent plenums. An inert gas such as argon or nitrogen is injected into the alternate pressurized cells and from the cells into the space between the cell and the foils 48, 49. This pressurized inert gas, along with any air or reactants which leaks past the wiper seal, is then exhausted through the evacuated adjacent alternate cell. Inert gas lines and vacuum lines can be plumbed through the plenums with openings into the appropriate alternate cells. A possible configuration for the plumbing at the input end of the apparatus is shown in the end view of the first input plenum in FIG. 6. The reaction gases, vacuum, and inert gases pass through the plenum 50 via tubes 52, 54, 56, respectively. The outermost plenum on the exhaust end would be similar, except that a tube would be provided for the exhaust of reaction products in place of the input 52 for the reaction gases. The plenums are located outside the heated reaction chamber and thus can be fabricated of any chemically resistant material.

While FIG. 1 shows the foils such as 22, 24 to be continuous, they need not be. Instead, elongated foils could be used which move through the furnace, act as deposition substrates, and then are collected, for example, in large rolls. Periodically the direction of motion of the foils through the furnace could be reversed with little time lost in the change-over. This embodiment results in long but finite length ribbons.

In a further embodiment, short lengths of rigid foil can be used. These could be foils of, say, 1-2 meters length that interlock to form a long foil. The short lengths are inserted at one end of the apparatus and are removed at the other end with the deposited ribbon on one surface. After separating the ribbon and foil, the foil is reinserted at the first end. The foils should be slightly wider than the width desired for the polycrystalline ribbon, such as from about 2 to 10 centimeters. In the flexible foil systems, the foil is desirably about 125 to 375 micrometers in thickness. A foil thicker than about 375 micrometers does not have the required flexibility. The rigid foil can be about 1 to 4 millimeters in thickness. Using either a continuous or non-continuous foil, occasional foil cleaning may be necessary. This can be accomplished without interrupting the deposition process, for example, by a cleaning station 60 shown schematically in FIG. 1. The cleaning station 60 could be a pair of abrasive rollers, an etch bath, or the like and would not affect the substantially continuous operation of the apparatus. The foils used as substrates for the deposition of polycrystalline silicone must be made of a refractory material which has a significantly different thermal expansion than that of silicon and which forms only a week metallurgical bond to silicon. The prior art has suggested the use of tantalum, but this metal has been found to be unsatisfactory. Tantalum suffers from hydrogen embrittlement at the elevated reaction temperatures and therefore cannot be reused in a continuous system. Molybdenum is a preferred material especially for the flexible foils, although other materials such as molybdenum alloys or tungsten have also been used. Additionally, the foils can be of quartz, silicon nitride, or the like. Especially for the rigid foil embodiment, the foils can be of silicon nitride coated with molybdenum or other refractory material.

Contamination of the polycrystalline ribbon by the substrate material is of some concern, especially because semiconductor device performance is extremely sensitive to impurity effects. By properly selecting the substrate material and because the high temperature deposition is of relatively short duration, diffusion of substrate contaminants into the deposited film is limited to a shallow depth. Consequently, subsequent to shear separation and prior to RTR conversion, a short back surface etch of the ribbon can be used to remove the thin contaminated layer.

The silicon bearing reaction gases can be any one of a number of halosilanes. Silane ($SiH_4$) is the preferred reaction gas because it requires a lower reaction temperature and because the reaction can be carried to completion, recovering all of the available silicon. Other preferred reaction gases include trichlorosilane or silicon tetrachloride and hydrogen, and silicon tetrafluoride. The furnace should be set to about 1000° C. for the silane deposition, and to about 1150° C. for deposition from trichlorosilane, silicon tetrachloride, or silicon tetrafluoride. Under these conditions a deposition rate of about 8 micrometers per minute is achieved and the resulting silicon is observed to be fine grained polycrystalline ribbon. The polycrystalline silicon ribbon is preferably deposited to a thickness between 50 and 250 micrometers with an optimal thickness (for solar cells) of 100 to 125 micrometers. Once the reaction gas and a temperature have been established, the thickness of the silicon ribbon is determined by the rate at which the foils move through the furnace. For a heated reaction zone of about 1 meter length, the optimum thickness is achieved with a foil speed of about 8 centimeters per minute. To deposit doped polycrystalline silicon, the reactant gas can be mixed with a dopant such as phosphine or arsine to produce N-doped ribbons or such as diborane or boron trichloride to produce P-doped ribbons. Other dopants in common use in the semiconductor industry could, of course, also be used as needed. For use in fabricating solar cells, the ribbon is preferably doped with diborane to yield macrocrystalline material having a resistivity of about 1 ohm centimeter after RTR conversion.

The apparatus is positioned with the furnace tube 18 vertically oriented for at least two reasons. First, the vertical system makes it easier to maintain the proper positioning of the foils within the furnace. In a horizontal furnace the foils on the top and sides of the tube tend to sag out of position. Secondly, the vertically oriented system provides a mixing of the reactant vapors within the reaction volume. This result is achieved by the cumulative effects of injecting the reactant gases in one end of the furnace and pumping them out the other combined with the thermal buoyancy of the gases. The combined forces result in a turbulence of the gases which provides a continuous mixing.

Figure 7:
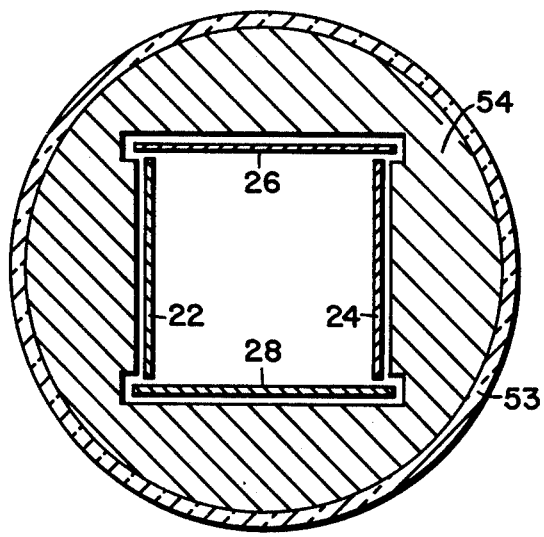
Figure 8:
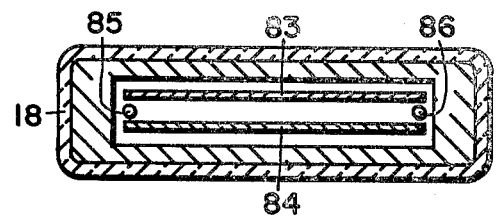

The apparatus has been described with particular reference to a rectangular shaped tube 18 and to four moving foils. Other configurations are possible and may even be preferable. The four foils could be used, for example, with a tube 53 having a circular cross-section as shown in FIG. 7. The guide block 55 is then shaped accordingly. Alternatively, the apparatus can be comprised of only two foils 83, 84 and two wires 85, 86 as shown in FIG. 8. This configuration maximizes the ratio of deposition surface area to reaction volume.

Figure 9:
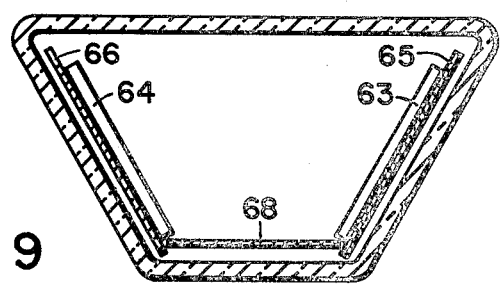

The method and apparatus have been described in detail for the production of polycrystalline silicon ribbon. The apparatus and the general technique of the method can also be used for the continuous production of epitaxial layers of silicon on monocrystalline silicon substrates. In a conventional epitaxial growth system a few monocrystalline silicon wafers at a time are loaded onto a graphite susceptor and the susceptor is placed in an RF induction heating furnace. The process then includes sequential steps such as purge, heat, deposit, purge, cool. This is an inefficient, costly and time consuming process. Following the method of this invention, the wafers can be attached to the moving foils and the epitaxial growth can be accomplished in a continuous process. Alternatively, a horizontal furnace tube 62 having a cross-sectional shape such as shown in FIG. 9 can be employed. The wafers 63, 64 would rest against and move with the side foils 65, 66. The wafers can be made to rotate as they move through the furnace by adjusting the speed of the bottom foil 68 relative to the speed of the side foils. The rotation helps to overcome nonuniformities in the temperature profile and thus improves uniformity across a wafer.

Thus it is apparent that there has been provided, in accordance with the invention, an apparatus and method for the deposition of polycrystalline silicon ribbons and monocrystalline epitaxial layers that fully satisfy the objects set forth above. While the invention has been described in conjunction with specific embodiments, it is evident that many alternatives, modifications and variations will be apparent to those skilled in the art in light of the foregoing description. Accordingly, it is intended to embrace all alternatives, modifications, and variations as fall within the spirit and broad scope of the following claims.

What is claimed is:

1. An apparatus for the formation of polycrystalline ribbon on elongated foil members and for the subsequent separation therefrom comprising in combination: a plurality of elongated foil members, each having two major surfaces; a furnace having input and output ends and capable of being heated to an elevated temperature; means for moving said foil members through the furnace; guide means for positioning the moving foil members to bound a reaction volume in the furnace, a first of said major surfaces of each of said foils facing said reaction volume; means for providing silicon bearing reactant vapors in the reaction volume bounded by said foil members wherein the vapors can react at the elevated temperature to deposit silicon on first of said major surfaces of each of said elongated foil members facing said reaction volume, said positioning of said foil members inhibiting deposition of silicon on said second of said surfaces; vapor sealing means located proximate the input and output ends and able to maintain a controlled ambient in the furnace while allowing the moving of the foil members; and means for separating the silicon from the elongated foil members.

2. The apparatus of claim 1 wherein the vapor sealing means comprise alternate pressurized and evacuated plenums.

3. The apparatus of claim 1 wherein the elongated foil members are closed metal loops.

4. The apparatus of claim 1 further comprising wire members located to further inhibit the deposition of silicon except on said one major surface.

5. The apparatus of claim 1 wherein adjacent foil members are in relative motion.

6. An apparatus for the deposition of silicon from a reactant gas onto a plurality of elongated foil members at an elevated temperature comprising: a furnace tube positioned in a furnace capable of being heated to the elevated temperature; a plurality of elongated foil members each having first and second surfaces; guide means located within said furnace tube for positioning said foil members with said first surfaces bounding a reaction volume to provide for preferential deposition on said first surface of each of said foil members and to inhibit deposition on said furnace tube and said second surfaces of said foil members; sealing means for maintaining a controlled ambient within said furnace tube; and means for providing reactant gas in said reaction volume, said reactant gas containing silicon for deposition on said foil members.

7. The apparatus of claim 6 wherein said furnace tube is vertically oriented.

* * * * *

UNITED STATES PATENT AND TRADEMARK OFFICE
CERTIFICATE OF CORRECTION

PATENT NO. : 4,250,148

DATED : February 10, 1981

INVENTOR(S) : Marlo E. Cota et al.

It is certified that error appears in the above—identified patent and that said Letters Patent is hereby corrected as shown below:

Column 8, claim 1, line 14, after "volume" and before the semicolon ";" insert -- said guide means further maintaining said foil members bounding said reaction volume substantially plane --.

Column 8, claim 6, line 47, after "members" and before the semicolon ";" insert -- , said guide means maintaining said foil members bounding said reaction volume substantially plane --.

Signed and Sealed this

Twenty-fifth Day of August 1981

[SEAL]

Attest:

Attesting Officer

GERALD J. MOSSINGHOFF

Commissioner of Patents and Trademarks